US009779610B2

(12) United States Patent
Gopisetti

(10) Patent No.: US 9,779,610 B2
(45) Date of Patent: Oct. 3, 2017

(54) AUTOMATED LOOP CHECK FOR SMART JUNCTION BOXES

(71) Applicant: Honeywell International Inc., Morris Plains, NJ (US)

(72) Inventor: Santosh Gopisetti, Hyderabad (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/971,912

(22) Filed: Dec. 16, 2015

(65) Prior Publication Data

US 2017/0178487 A1  Jun. 22, 2017

(51) Int. Cl.

| G08B 21/00 | (2006.01) |
|---|---|
| G08B 21/18 | (2006.01) |
| H04W 4/00 | (2009.01) |
| G01R 31/02 | (2006.01) |
| G01R 19/00 | (2006.01) |
| G01R 31/04 | (2006.01) |
| H04W 84/12 | (2009.01) |

(52) U.S. Cl.
CPC ....... *G08B 21/182* (2013.01); *G01R 19/0084* (2013.01); *G01R 31/021* (2013.01); *G01R 31/041* (2013.01); *H04W 4/008* (2013.01); *H04W 84/12* (2013.01)

(58) Field of Classification Search
CPC .................................................. G08B 21/182
USPC ...... 340/660, 661, 662, 663, 539.1; 710/100
See application file for complete search history.

(56) References Cited

U.S. PATENT DOCUMENTS

| 4,334,307 A | 6/1982 | Bourgeois |
| 4,384,327 A | 5/1983 | Conway |
| 2014/0149630 A1* | 5/2014 | Burr .................... G05B 19/042 710/315 |

* cited by examiner

*Primary Examiner* — Jeffery Hofsass

(57) ABSTRACT

A system includes a marshalling cabinet, a plurality of junction boxes, and an interface. The marshalling cabinet is configured to source a voltage in a plurality of cables through junction boxes to a plurality of field devices. Each of the junction boxes is configured to detect the voltage from the marshalling cabinet and transmit a detection message upon detecting the voltage. The interface is configured to receive the detection messages from the respective junction boxes that detect the voltage.

21 Claims, 3 Drawing Sheets

AUTOMATED LOOP CHECK FOR SMART JUNCTION BOXES

TECHNICAL FIELD

This disclosure is generally directed to industrial process control and automation systems. More specifically, this disclosure is directed to an automated loop check for smart junction boxes.

BACKGROUND

Loop checking is the process of validating and verifying the accuracy of cables that are laid from control panels to field instruments, which ensures that the right transmitter is connect to the correct Input/Output (I/O) port of a controller. Loop checking is an important activity in a plant during installation, commissioning and maintenance phases. In many plants, loop checking is a mandatory activity that cannot be eliminated and consumes large amounts of time, cost and manpower. Loop checking requires multiple people working together to ensure that the loop is properly connected to I/O ports and a marshalling cabinet. Loop checking needs to be completed before powering up of a field instrument or marshalling cabinet.

SUMMARY

This disclosure provides an apparatus and method for automated loop checking is a process system with smart junction boxes.

In a first embodiment, a system is provided. The system includes a marshalling cabinet, a plurality of junction boxes, and an interface. The marshalling cabinet is configured to source a voltage in a plurality of cables through junction boxes to a plurality of field devices. Each of the junction boxes is configured to detect the voltage from the marshalling cabinet and transmit a detection message upon detecting the voltage. The interface is configured to receive the detection messages from the respective junction boxes that detect the voltage.

In a second embodiment, a method is provided. The method includes controlling, by an interface, a marshalling cabinet to source a voltage. The method also includes monitoring, at the interface, a detection of the voltage by a junction box. The method further includes reporting, at the interface, the detection of the voltage at the junction box.

In a third embodiment, a method is provided. The method includes providing, by an interface, a smart protocol command to embedded hardware in a marshalling cabinet and a junction box to perform a loop test. The smart protocol command controls the embedded hardware to source a voltage at a marshalling cabinet through a cable to a field device, detect the voltage from the marshalling cabinet, and transmit a confirmation message to the interface upon detecting the voltage.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Loop checking is the process of validating and verifying the accuracy of cables that are laid from control panels to field instruments, which ensures that the right transmitter is connect to the correct Input/Output (I/O) port of a controller. The junction boxes reduce the amount of cable required and also help reduce troubleshooting time during failures. When the cables are checked for failures, the cables between junction boxes are tested by detecting a signal transmitted from a control panel to specific field devices. Currently, each cable is manually tested by a group of people from a cable source (such as a marshalling cabinet) to a destination (such as a field transmitter), which is time consuming.

Figure 1:
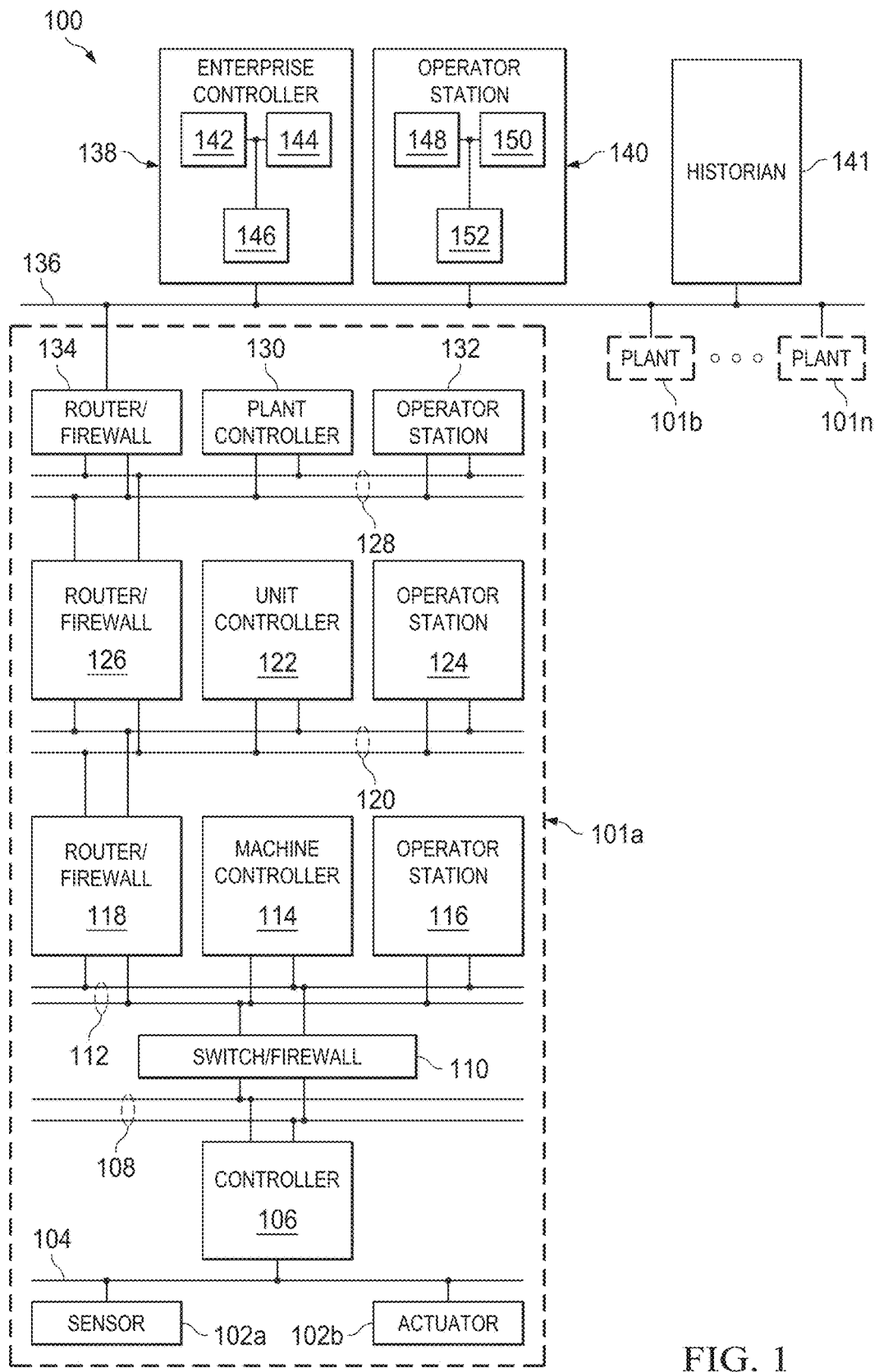
FIG. 1 illustrates an example industrial control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, flow rate, or a voltage transmitted through a cable. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS (FF) network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Multiple controllers 106 could also operate in redundant configurations, such as when one controller 106 operates as a primary controller while another controller 106 operates as a backup controller (which synchronizes with the primary controller and can take over for the primary controller in the event of a fault with the primary controller). Each controller 106 includes any suitable structure for interacting with one or more sensors 102a and controlling one or more actuators 102b. Each controller 106 could, for example, represent a multivariable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

Two networks 108 are coupled to the controllers 106. The networks 108 facilitate interaction with the controllers 106, such as by transporting data to and from the controllers 106. The networks 108 could represent any suitable networks or combination of networks. As particular examples, the networks 108 could represent a pair of Ethernet networks or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as a pair of Ethernet networks or an FTE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as a pair of Ethernet networks or an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102a, and actuators 102b).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as a pair of Ethernet networks or an FTE network.

In the Purdue model, "Level 4" may include one or more plant-level controllers 130 coupled to the networks 128. Each plant-level controller 130 is typically associated with one of the plants 101a-101n, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101a-101n and to control various aspects of the plants 101a-101n. The enterprise-level controllers 138 can also perform various functions to support the operation and control of components in the plants 101a-101n. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101a is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers could include one or more processing devices 142 and one or more memories 144 for storing instructions and data used, generated, or collected by the processing device(s) 142. Each of the controllers could also include at least one network interface 146, such as one or more Ethernet interfaces or wireless transceivers. Also, each of the operator stations could include one or more processing devices 148 and one or more memories 150 for storing instructions and data used, generated, or collected by the processing device(s) 148. Each of the operator stations could also include at least one network interface 152, such as one or more Ethernet interfaces or wireless transceivers.

In accordance with this disclosure, various components of the system 100 support a process for an automated loop check in the system 100. For example, the controllers 104a-104b may represent field device controllers, and the process elements 102a-102b may represent field devices. Also, one or more components of the system 100 may include a junction box, such as a smart junction box. Additional details regarding this functionality are provided below.

Although FIG. 1 illustrates one example of an industrial process control and automation system 100, various changes may be made to FIG. 1. For example, a control system could include any number of sensors, actuators, controllers, servers, operator stations, and networks. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, process control systems are highly configurable and can be configured in any suitable manner according to particular needs.

Figure 2:
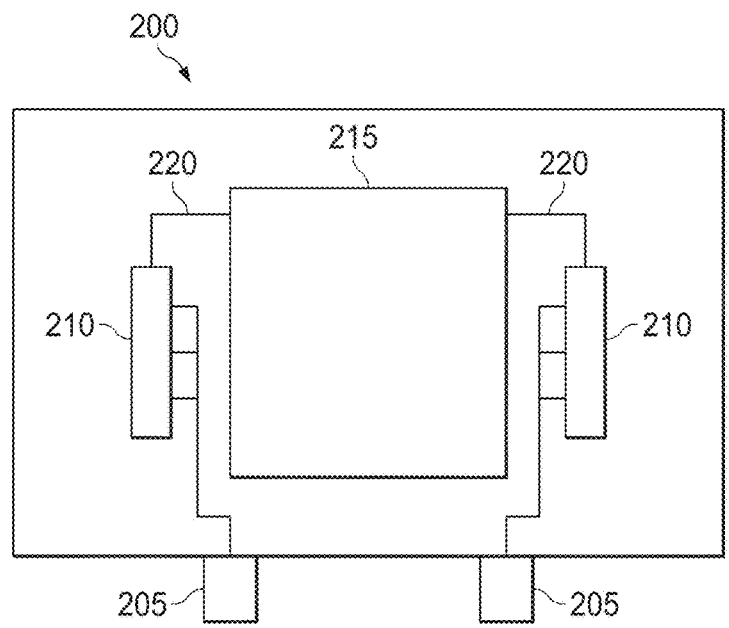
FIG. 2 illustrates an example junction box according to this disclosure.

FIG. 2 illustrates an example junction box 200 according to this disclosure. For ease of explanation, the junction box 200 is described as being used in the system 100 of FIG. 1. For example, the junction box 200 may be located between a controller 106 and a sensor 102a, an actuator 102b, another component, or a combination of components described in FIG. 1. However, the junction box 200 could be used in any other suitable system.

The junction box 200 includes gland entries 205, field termination blocks 210 and hardware 215. The gland entries 205 secure the ends of cables from other junction boxes or field devices. The field termination blocks 210 connect to each cable connected to the junction box 200 and transmit signals to the embedded hardware 215 through a ribbon cable 220. The hardware 215 includes components such as Wi-Fi, BLUETOOTH, relay, and HART or FF modem capabilities. The hardware 215 is used to detect signals or voltages transmitted through the cables. The hardware 215 is configured to transmit one or more messages or signals using the Wi-Fi, BLUETOOTH, relay, and HART or FF modem capabilities.

Although FIG. 2 illustrates one example of a junction box 200, various changes may be made to FIG. 2. For example, the number(s) and type(s) of components shown in FIG. 2 are for illustration only. Also, the functional divisions of the junction box 200 shown in FIG. 2 are for illustration only. Various components in FIG. 2 could be omitted, combined, or further subdivided and additional components could be added according to particular needs.

Figure 3:
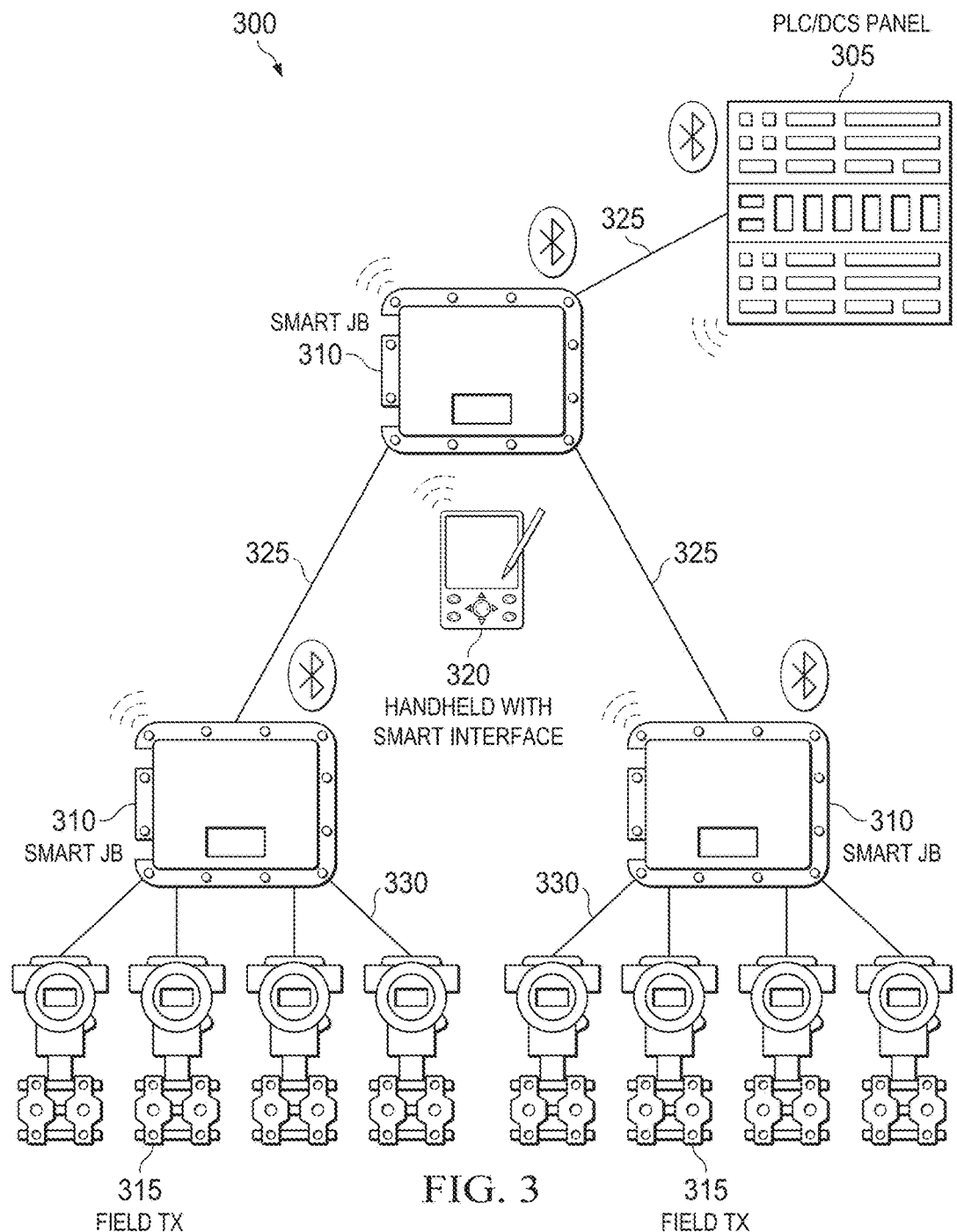
FIG. 3 illustrates an example wiring schedule for automatic loop checking according to this disclosure.

FIG. 3 illustrates an example wiring schedule 300 for automatic loop checking according to this disclosure. The wiring schedule 300 includes a marshalling cabinet 305, a plurality of junction boxes 310, a plurality of field devices 315, and an interface 320. The wiring schedule 300 includes the wiring routes between each field device 315 and the marshalling cabinet 305.

The marshalling cabinet 305 interfaces with a cable bundle 325 from one or more junction boxes 310. The marshalling cabinet 305 receives a signal transmitted from one of the field devices 315 and relayed through a junction box 310. The marshalling cabinet 305 can source a small voltage, such as three to seven volts, through the cable to the field devices 315. The marshalling cabinet 305 can communicate using different methods, such as Wi-Fi, BLUETOOTH, or any other suitable wired or wireless communication method.

Each field device 315 is coupled to a junction box 310 via a cable 330. The cables 330 are bundled at the junction boxes 310 to form a cable bundle 325 upstream of the junction box 310. A junction box 310 can also combine multiple bundles 325 into a single cable bundle 325, as illustrated between the junction box 310 and the marshalling cabinet 305. The junction boxes 310 include an embedded circuit that monitors the voltage at respective pins connected to each cable 330. The junction boxes 310 route the cable bundles 325 from the marshalling cabinet 305 and individual cables 330 to the plurality of field devices 315. While FIG. 3 illustrates that a single junction box 310 is connected to the marshalling cabinet 305, the marshalling cabinet 305 can be connected to multiple junction boxes 310 by different cable bundles 325.

The field devices 315 can be located throughout a process system that encompasses a large area. The junction boxes 310 can be located by field devices 315 grouped in proximity in order to reduce the complexity of the wiring schedule 300 due to the cable bundles 325 between the junction boxes 310 and the marshalling cabinet 305. The junction boxes 310 can detect the voltage sourced from the marshalling cabinet 305. The junction boxes 310 can communicate using different methods, such as Wi-Fi, BLUETOOTH, or any other suitable wired or wireless communication method.

In certain embodiments, interface 320 is carried and cable route, bend information, etc. are marked using GPS capabilities in interface 320 during the cable laying activity as per the wiring schedule 300. This enhances the ability to locate cables 330 and 325 easily for repairs or troubleshooting activities later.

The interface 320 can be carried to or located on any of the marshalling cabinet 305, the junction boxes 310, or a separate device, such as a cell phone or tablet. The interface 320 communicates with the marshalling cabinet 305, junction boxes 310, etc. using different methods, such as Wi-Fi, BLUETOOTH, or any other suitable wired or wireless communication method. The interface 320 can control the marshalling cabinet 305 to perform different functions, including sourcing a voltage. The interface 320 can monitor the detection of the voltage by the junction boxes 310, including live monitoring or real-time monitoring of the loop voltages and currents. The interface 320 can report the loop checking activities. The interface 320 can also detect the loading or malfunctioning of the field devices. An automated loop check can be initiated from a junction box 310 using the interface 320.

The wiring schedule 300 can be imported to the interface 320 from an external source or a memory in a component, such as a smart junction box 310 or the marshalling cabinet 305. Using the wiring schedule 300, the interface 320 can initiate the loop check and monitor the voltages generated by the marshalling cabinet 305 or the junction boxes 310. Using the wiring schedule 300, the interface 320 can provide navigation support to the field devices 315 and field device cabling.

Although FIG. 3 illustrates one example of a wiring schedule 300, various changes may be made to FIG. 3. For example, the number(s) and type(s) of components shown in FIG. 3 are for illustration only. Also, the functional divisions of the wiring schedule 300 are for illustration only. Various components in FIG. 3 could be omitted, combined, or further subdivided and additional components could be added according to particular needs.

Figure 4:
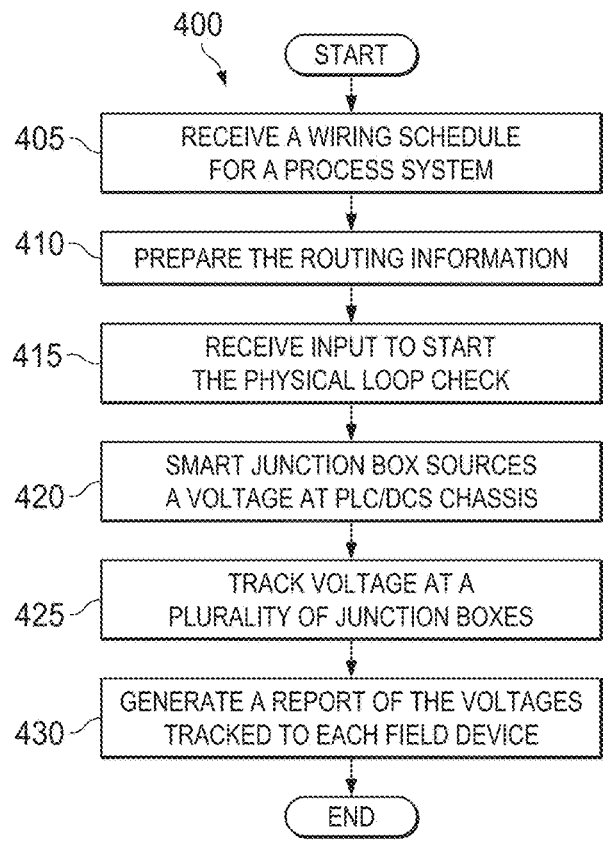
FIG. 4 illustrates an example method for automatic loop checking according to this disclosure.

FIG. 4 illustrates an example method 400 for automatic loop checking according to this disclosure. For ease of explanation, the method 400 is described with respect to the junction box 200 and wiring schedule 300 shown in FIGS. 2 and 3. However, the method 400 could be used by any suitable field device and in any suitable system.

The method 400 includes block 405, in which the interface 320 receives a wiring schedule 300 for the process system. In block 410, the interface 320 analyzes and prepares the routing information including all of the wiring routes found in the wiring schedule 300. In block 415, the interface 320 receives an input to start a physical loop check, such as either by a physical touch or voice input.

In block 420, the interface 320 controls the marshalling cabinet 305 to source a voltage. The interface 320 can connect to the marshalling cabinet 305 or any junction box 310. The interface 320 can transmit a command to simulate a voltage or current, such as by using HART/FF commands and HART/FF modem hardware in the hardware 215.

In block 425, the interface 320 tracks the voltage from the marshalling cabinet 305 to the field device 315. Blocks 420 and 425 are repeated for each field device 315. In block 430, the interface 320 generates a report of the voltages tracked to the field devices 315.

Although FIG. 4 illustrates one example of a method 400 for automatic loop checking in a field device, various changes may be made to FIG. 4. For example, while shown as a series of steps, various steps shown in FIG. 4 could overlap, occur in parallel, or occur multiple times. Moreover, some steps could be combined or removed and additional steps could be added.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

The description in this patent document should not be read as implying that any particular element, step, or function is an essential or critical element that must be included in the claim scope. Also, none of the claims is intended to invoke 35 U.S.C. §112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. §112(f).

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
   a plurality of junction boxes each configured to transmit a detection message upon detecting a voltage received;
   a marshalling cabinet configured to source the voltage through at least one of the junction boxes to a field device; and
   an interface configured to receive the detection message from each of the at least one junction box that detects the voltage.

2. The system of claim 1, wherein each of the junction boxes is configured to transmit the detection message over a Wi-Fi network.

3. The system of claim 1, wherein the junction boxes are further configured to communicate using BLUETOOTH.

4. The system of claim 1, wherein the junction boxes are further configured to communicate using a wired or wireless connection.

5. The system of claim 1, wherein the interface is further configured to:
   control the marshalling cabinet to source the voltage;
   monitor the junction boxes; and
   report the at least one junction box that detects the voltage.

6. The system of claim 5, wherein the interface is configured to monitor the junction boxes by live monitoring loop voltages and currents detected from the junction boxes.

7. The system of claim 1, wherein the interface is further configured to:
   detect malfunctioning of at least one of the junction boxes; and
   detect loading of at least one of the junction boxes.

8. The system of claim 1, wherein the interface is further configured to provide navigation support to a plurality of field devices and field device cabling.

9. The system of claim 1, wherein the interface is further configured to:
   import a wiring schedule of cables connecting the marshalling cabinet, the junction boxes and the field device; and
   generate a wiring route from the marshalling cabinet to the field devices based on information in the wiring schedule.

10. The system of claim 1, wherein the interface is further configured to perform an automated loop check from at least one of the junction boxes.

11. The system of claim 9, wherein the interface is further configured to track the cables by marking the cables' routes.

12. A method comprising:
    controlling, by an interface, a marshalling cabinet to source a voltage through at least one junction box among a plurality of junction boxes to a field device;
    monitoring, at the interface, the plurality of junction boxes for a detection of the voltage by the at least one junction box; and
    reporting, at the interface, the at least one junction box that detects of the voltage.

13. The method of claim 12, wherein monitoring the detection of the voltage by the at least one junction box occurs over a Wi-Fi network.

14. The method of claim 12, wherein monitoring the detection of the voltage by the at least one junction box occurs using a BLUETOOTH connection.

15. The method of claim 12, wherein monitoring the detection of the voltage by the at least one junction box comprises live monitoring of loop voltages and currents detected by the at least one junction box.

16. The method of claim 12, further comprising at least one of:
    detecting, by the interface, a malfunctioning of at least one of the junction boxes; and
    detecting, by the interface, a loading of at least one of the junction boxes.

17. The method of claim 12, further comprising:
    providing, at the interface, navigation support to a plurality of field devices and field device cabling.

18. The method of claim 12, further comprising:
importing, at the interface, a wiring schedule of cables connecting the marshalling cabinet, the junction boxes and the field device; and
generating, at the interface, a wiring route from the marshalling cabinet to the field device based on information in the wiring schedule.

19. The method of claim 12, further comprising:
performing, by the interface, an automated loop check from at least one of the junction boxes.

20. The method of claim 18, further comprising:
tracking, by the interface, the cables by marking the cables' routes.

21. A method comprising:
providing, by an interface, a smart protocol command to embedded hardware in a marshalling cabinet and a plurality of junction boxes to perform a loop test;
wherein the smart protocol command controls the embedded hardware to:
  source a voltage at the marshalling cabinet through at least one of the junction boxes to a field device;
  detect the voltage from the at least one junction box; and
  transmit, by the at least one junction box, at least one confirmation message to the interface upon detecting the voltage.

* * * * *